US010426059B2

(12) United States Patent
Dhote et al.

(10) Patent No.: US 10,426,059 B2
(45) Date of Patent: Sep. 24, 2019

(54) SYSTEM AND METHOD TO ENHANCE AIRFLOW REQUEST ALGORITHM FOR MODULAR CHASSIS

(71) Applicant: Dell Products, L.P., Round Rock, TX (US)

(72) Inventors: Komal Kumar Dhote, Raipur (IN); Santosh Kumar Sahu, Gondala (IN)

(73) Assignee: Dell Products, L.P., Round Rock, TX (US)

( * ) Notice: Subject to any disclaimer, the term of this patent is extended or adjusted under 35 U.S.C. 154(b) by 257 days.

(21) Appl. No.: 15/162,881

(22) Filed: May 24, 2016

(65) Prior Publication Data

US 2017/0347494 A1 Nov. 30, 2017

(51) Int. Cl.
*H05K 7/20* (2006.01)
*G06F 1/20* (2006.01)

(52) U.S. Cl.
CPC ......... *H05K 7/20736* (2013.01); *G06F 1/206* (2013.01); *H05K 7/20836* (2013.01)

(58) Field of Classification Search
CPC ........... H05K 7/20736; H05K 7/20836; G05B 19/406; G05B 19/4155; G05B 2219/49216
USPC ........................................................ 700/300
See application file for complete search history.

(56) References Cited

U.S. PATENT DOCUMENTS

2011/0160916 A1* 6/2011 Bahali ................ G05D 23/1934 700/282
2014/0277784 A1* 9/2014 Mick .................. G05D 23/1917 700/286
2015/0192937 A1 7/2015 Govindarajan et al.
2016/0266560 A1* 9/2016 Chou .................. G05B 19/042
2018/0003186 A1* 1/2018 Matsuura ............. F04D 27/004

* cited by examiner

*Primary Examiner* — Kenneth M Lo
*Assistant Examiner* — Michael W Choi
(74) *Attorney, Agent, or Firm* — Fogarty LLP

(57) ABSTRACT

Methods, systems and devices are provided for configuring an airflow cooling system shared by a plurality of IHSs (Information Handling Systems). An initial fan speed is set by a chassis manager that controls airflow cooling shared by the IHSs. The chassis manager broadcasts the initial fan speed to the plurality of IHSs. Each IHS receives the initial fan speed broadcast and determines its own fan speed requirements. If an IHS requires a fan speed greater than the initial fan speed, the IHS broadcasts a fan speed request. Each IHS continues to monitor fan speed broadcasts and broadcasts a request if its determined fan speed is greater than the most recent broadcast. The IHS that broadcasts the greatest fan speed request is designated as the dominant IHS. The chassis manager sets the airflow cooling system fan speed based on the fan speed requests broadcast by the dominant IHS.

20 Claims, 4 Drawing Sheets

SYSTEM AND METHOD TO ENHANCE AIRFLOW REQUEST ALGORITHM FOR MODULAR CHASSIS

FIELD

This disclosure relates generally to airflow cooling within an information handling system (IHS), and more specifically, to fan speed management within an information handling system.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Components of an IHS consume electrical power and can generate significant amounts of heat. Heat within an IHS may degrade the reliability and performance of IHS components, possibly resulting in costly malfunctions and component failures. In order to dissipate generated heat, an IHS may include a cooling fan, or a plurality of cooling fans organized with an airflow cooling system. Cooling fans may have different characteristics. Certain of these fan characteristics may be configurable, such as the operating speed of a fan. As temperatures within an IHS increase, the speed of a fan can be likewise increased to ventilate more heated air from within the IHS. In an IHS utilizing an airflow cooling system comprising a plurality of fans, a centralized controller may respond to increased temperatures by ventilating more air by increasing the operating speed of some or all of the fans in the system. In order to conserve power, an airflow cooling system may also be configured to decrease fan speeds in response to lower temperatures within the IHS.

Various components within the IHS may be outfitted with sensors that monitor operating temperatures at various locations in the system. Based on temperature readings provided by such sensors, corresponding fan speed adjustments may be requested from an airflow cooling system via fan request messages. Based on the fan request messages received from various components within the system, the IHS determines the appropriate fan speed setting that will provide adequate ventilation.

SUMMARY

According to various embodiments, a method for configuring airflow cooling shared by a plurality of IHSs (Information Handling Systems), where the method comprises setting a cooling fan to an initial fan speed; broadcasting the initial fan speed to the plurality of IHSs; receiving a plurality of fan requests broadcast by one or more IHSs comprising the plurality of IHSs, wherein each fan request broadcast comprises a fan speed request that is greater than the initial fan speed; designating the IHS with the maximum fan speed as the dominant IHS; and setting the cooling fan to the fan speed provided by the dominant IHS.

According to various additional embodiments, the method further comprises receiving an additional fan request broadcast from a first IHS wherein the additional fan request broadcast comprises a second fan speed; and determining whether the first IHS is designated as the dominant IHS. According to various additional embodiments, the method further comprises setting the cooling fan to the second fan speed, if the first IHS is designated as the dominant IHS. According to various additional embodiments, the method further comprises determining if the second fan speed is greater than the current fan speed, if the first IHS is not designated as the dominant IHS. If the second fan speed is greater than the current fan speed, according to various additional embodiments, the method further comprises setting the cooling fan to the second fan speed; and designating the first IHS as the dominant IHS. According to various additional embodiments, the fan request broadcasts are IPMI (Intelligent Platform Management Interface) commands. According to various additional embodiments, the plurality of IHS are rack servers housed within a rack providing a shared airflow cooling system. According to various additional embodiments, the method further comprises broadcasting a default fan speed upon detecting the addition of an IHS to the plurality of IHSs.

According to various embodiments, a method for configuring a fan speed for providing airflow cooling to an IHS comprised within a plurality of IHSs comprises receiving an initial fan speed; determining a first fan request specifying a first fan speed for providing airflow cooling required by the IHS; determining whether the first fan speed is greater than the initial fan speed; and if the first fan speed is greater than the initial fan speed, broadcasting the first fan request.

According to various additional embodiments, the first fan request is determined based on temperature measurements provided by one or more sensors. According to various additional embodiments, the first fan request is determined based on a thermal table. According to various additional embodiments, the method further comprises receiving one or more fan requests broadcast respectively by one or more IHSs comprised within the plurality of IHS, wherein each received fan request broadcast comprises a received fan speed. According to various additional embodiments, the method further comprises determining whether the first fan speed is greater than each received fan speed. According to various additional embodiments, the method further comprises designating the IHS as the dominant IHS, if the first fan speed is greater than each received fan speed. According to various additional embodiments, the method further comprises receiving an updated fan request broadcast by a second IHSs comprised within the plurality of IHS, wherein the updated fan request broadcast comprises an updated fan speed greater than the first fan speed. According to various additional embodiments, the method further comprises designating the second IHS as the dominant IHS.

According to various embodiments, a chassis manager providing airflow cooling to a plurality of IHSs (Information Handling Systems) comprises a host processor; and a computer readable medium coupled to the host processor, the computer readable medium having program instructions stored thereon that, upon execution by the host processer, cause the chassis manager to: set a cooling fan to an initial fan speed; broadcast the initial fan speed to the plurality of IHSs; receive a plurality of fan requests broadcast by one or more IHSs comprising the plurality of IHSs, wherein each fan request broadcast comprises a fan speed request that is greater than the initial fan speed; designate the IHS with the greatest fan speed as the dominant IHS; and set the cooling fan to the greatest fan speed provided by the dominant IHS.

According to various additional embodiments, the program instructions, upon execution by the host processer, cause the chassis manager to receive an additional fan request broadcast from a first IHS wherein the additional fan request broadcast comprises an additional fan speed; and determine whether the first IHS is designated as the dominant IHS. According to various additional embodiments, the program instructions, upon execution by the host processer, cause the chassis manager to set the cooling fan to the additional fan speed, if the first IHS is designated as the dominant IHS. According to various additional embodiments, the program instructions, upon execution by the host processer, cause the chassis manager to determine if the additional fan speed is greater than the greatest fan speed, if the first IHS is not designated as the dominant IHS.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, a network router, a network video camera, a data recording device used to record physical measurements in a manufacturing environment, or any other suitable device and may vary in size, shape, performance, functionality, and price. The IHS may include memory, one or more processing resources, e.g., a central processing unit (CPU) or hardware or software control logic. Additional components or the IHS may include one or more storage devices, one or more communications ports for communicating with external devices as well as various input and output (I/O) devices, e.g., a keyboard, a mouse, and a video display. The IHS may also include one or more buses operable to transmit communication between the various hardware components.

Also for purposes of this disclosure, computer-readable media may include any instrumentality or aggregation of instrumentalities that may retain data and/or instructions for a period of time. Computer-readable media may include, without limitation, storage media, e.g., a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory. Computer-readable media may also include optically readable barcodes (one or two-dimensional), plastic cards with embedded magnetic stripes, mechanically or optically read punched cards, or radio frequency identification tags.

An individual IHS may include one or more of various types of server components. For instance, an IHS may include one or blade server components, where each blade server is housed within a chassis that allows the blade server to be stacked within a rack enclosure. Alternatively or in addition, an IHS may include one or more rack server components that can be stacked directly within a rack enclosure. Alternatively or in addition, an IHS may also include one or more tower server components that need not be stacked or otherwise housed in a rack enclosure, but may be adapted for such implementations. Embodiments provide improved management of airflow cooling resources within IHSs that include shared cooling resources, such as in a rack of server components that share a system of one or more fans.

Figure 1:
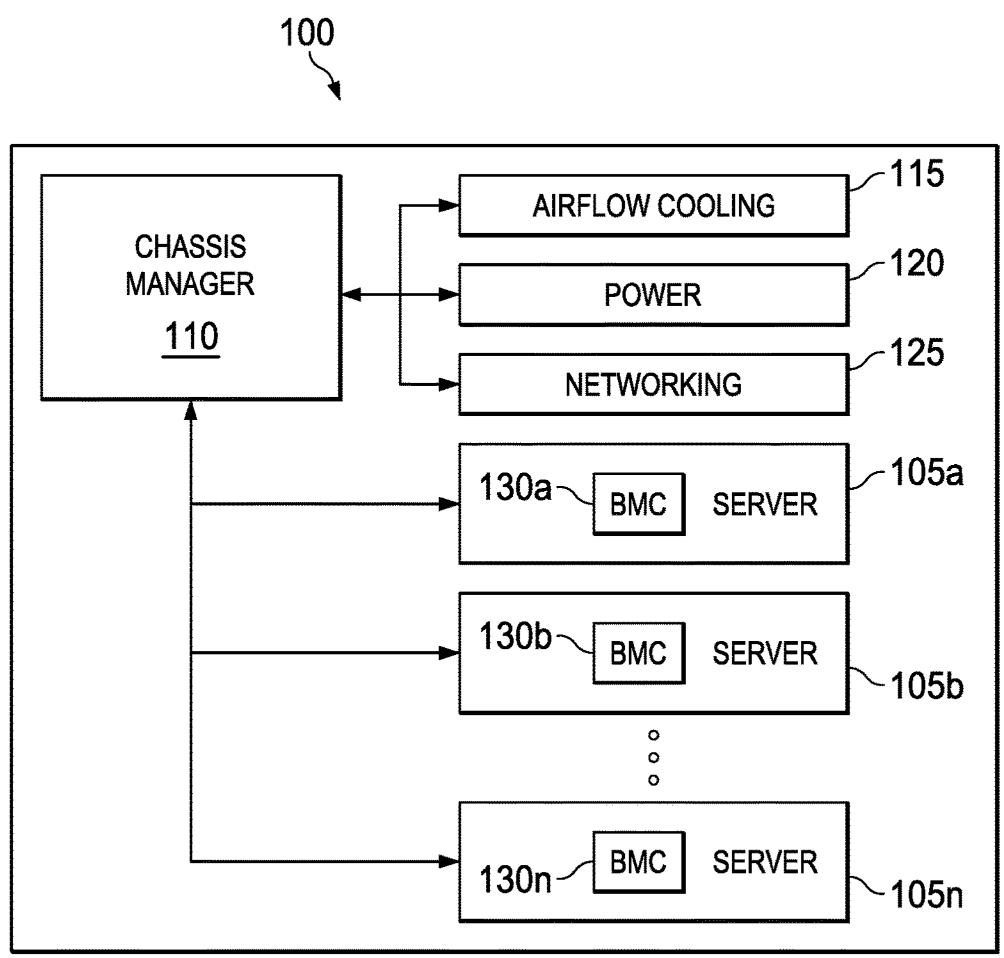
FIG. 1 is a block diagram depicting certain components of an IHS configured according to various embodiments.

FIG. 1 is a diagram illustrating certain components of an IHS configured to implement the systems and methods described herein according to various embodiments. It should be appreciated that although certain embodiments described herein may be discussed in the context of a rack of server computers, other embodiments may be utilized with virtually any type of type of computer that includes a cooling system.

In the embodiment of FIG. 1, a plurality of servers 105*a-n* are housed within a rack enclosure 100. According to various embodiments, the plurality of servers 105*a-n* may be various combinations of server components, such as rack servers, blade servers and/or tower servers. For instance, in certain embodiments, the plurality of servers 105*a-n* may be comprised of arrays of similarly configured rack servers. As components housed with a shared rack enclosure 100, the plurality of servers 105*a-n* utilize certain shared infrastructure resources. These shared infrastructure resources may be managed by a chassis manager 110. In the embodiment of FIG. 1, the chassis manager 110 manages the power 120, networking 125 and airflow cooling 115 resources that are provided to the components housed within the rack enclosure 100. The chassis manager may support additional shared infrastructure resources and thus may interoperate with various other subsystems in addition to a shared airflow cooling system.

The airflow cooling system 115 provided by the rack enclosure may consist of one or more fans that are controlled by the chassis manager 110. The chassis manager 110 may control the fans of the airflow cooling system 115 based on airflow messages that are communicated by the various components of the rack enclosure 100 that rely on the airflow cooling system 115. For instance, in the embodiment illustrated in FIG. 1, the chassis manager 110 controls the fan speed, and thus regulates airflow cooling, based on airflow messages communicated with the plurality of servers 105*a-n*. In certain embodiments, the chassis manager 110 and the plurality of servers 105*a-n* communicate airflow messages using utilizing IPMI (Intelligent Platform Management Interface).

In certain embodiments, each of the plurality of servers 105*a-n* may include a Baseboard Management Controller (BMC) 130*a-n*. A BMC is a specialized microcontroller or service processor, which manages the interface between the system management software and the server hardware. According to various embodiments, each BMC 130*a-n* may utilize sensors to monitor the physical and operational state of a server 105*a-n*. In certain embodiments, each BMC 130*a-n* includes a management interface that allows various aspects of the server to be administered remotely. In certain embodiments, a BMC 130*a-n* implements certain monitoring and management function utilizing IPMI (Intelligent Platform Management Interface). As a non-limiting example of a BMC, the integrated Dell Remote Access Controller (iDRAC) from Dell® is embedded within Dell PowerEdge™ servers and provides functionality that helps information technology (IT) administrators deploy, update, monitor, and maintain servers remotely.

Figure 2:
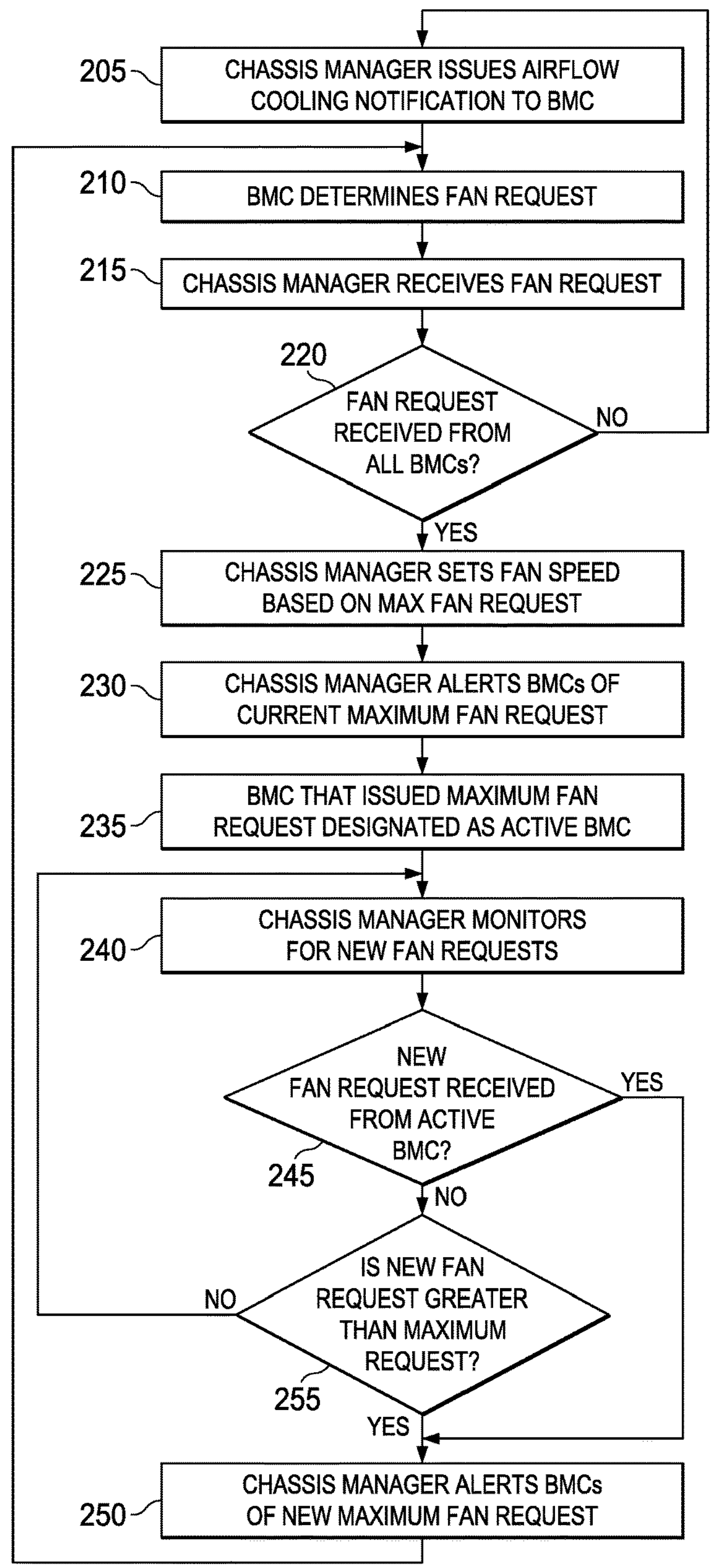
FIG. 2 is a flowchart depicting certain steps of a process for controlling fan speeds within an IHS.

FIG. 2 depicts certain steps of a process that may be used within IHSs for controlling fan speeds based on fan request messages. As described with respect to FIG. 1, an IHS may utilize a chassis manager to provide airflow cooling for multiple severs comprised within a rack, where each server utilizes a BMC to interoperate with the chassis manager and each BMC manages airflow cooling on behalf of a corresponding server. The process begins at step 205 with the chassis manager issuing an airflow cooling notification to a BMC that manages the cooling for a server, such as a rack server comprised within a rack structure. The airflow cooling notification serves to signal a BMC to report a fan request to the chassis manager.

In response to the airflow cooling notification issued by the chassis manager, at step 210, the BMC determines a fan request that satisfies the airflow cooling needs of the corresponding server. The BMC may utilize input from various sensors, including temperature sensors located within the server, to determine the fan request. In certain scenarios, the BMC may rely on a thermal table to determine the fan request. A thermal table provides the BMC with the ability to convert temperature measurements within the server to a specific fan speed necessary to provide adequate cooling for the server in light of the measured temperatures. This fan speed may be then incorporated into a fan request, which is transmitted to the chassis manager by the BMC at step 215.

The chassis manager repeats this process for the BMCs of each server component relying on the airflow cooling system provided by the chassis manager. At step 220, the chassis manager retries issuing an airflow cooling notification to any BMC for which no fan request has been received by the chassis manager. This process by which the chassis manager receives a fan request from each participating BMC and selects the maximum fan request that is received may be referred as an auction process. In a fully completed auction process, the chassis manager receives fan requests from all participating BMCs before determining a maximum fan request. In certain scenarios, the chassis manager may be configured to reissue airflow cooling notifications to a non-responsive BMC for a predefined number attempts at completing the auction process. In certain scenarios, the chassis manager may be configured to proceed with a partially completed auction process if a fan request is not received from a BMC within a specified timeout threshold.

If the auction process is completed and fan requests have been received from all BMCs, or if configured to proceed without a completed auction process, the chassis manager determines the maximum fan speed provided in the received fan requests. At step 225, the chassis manager sets the fan speed for use by the airflow cooling system based on the determined maximum fan speed. At step 230, the chassis manager alerts each of the BMCs of the current maximum fan request. The BMC that issued the maximum fan request, as determined by the chassis manager, is designated as the active BMC at step 235. All other participating BMCs are designated as passive BMCs.

The airflow cooling system sets the fan speed based on the maximum fan request that is received upon completion of the auction process and, at step 240, the chassis manager monitors for the receipt of new fan request messages from the participating BMCs. At step 245, the chassis manager receives a new fan request message. If the new fan request message is received from the BMC designated as the active BMC, at step 250, the chassis manager adjusts the airflow cooling and issues an alert to each of the participating BMCs in order to notify each BMC of the new fan speed setting. Each of the BMCs then reverts to step 210 and, based on the current temperature measurements of the corresponding server, each BMC determines a new fan request that may be issued to the chassis manager. The chassis manager then processes the received fan requests in another auction process to determine if a different BMC has provided a fan request that is greater than the updated fan request provided by the active BMC, and thus also determining whether a different BMC should be designated as the active BMC.

If a new fan request message that is received by the chassis manager at step 245 is from a passive BMC, an alert notification may be issued by the chassis manager depending on whether the fan request received from the passive BMC is greater than the current maximum fan request of the active BMC. At step 255, the chassis manager determines that a new fan request is being issued by a passive BMC. If the new fan request from the passive BMC is not greater than the current maximum fan request of the active BMC, no further action is taken by the chassis manager with respect to this new fan request and the chassis manager reverts to monitoring for new fan requests at step 240. If the fan request received from the passive BMC is greater than the current maximum fan request at step 225, the chassis manger adjusts the airflow cooling to comply with the new maximum fan request and issues an alert notifying each BMC of the new fan speed setting. The BMC that issued the new maximum fan request becomes the active BMC.

One disadvantage of the process described with respect to FIG. 2 is the number of messages that is required to implement such a process. For instance, each time an active BMC detects temperature conditions that warrant a change to the current fan speed, the chassis manager issues an alert notifying each participating BMC of the update to the fan request of the active BMC. Such an alert may be issued for every increase or decrease in the fan speed requested by the active BMC. Another disadvantage is the dependence on fan requests from participating BMCs to initiate airflow cooling management. For instance, in FIG. 2, the chassis manager does not determine a maximum fan speed or set a fan speed for the cooling system until the auction process is completed such that fan requests have been received from all participating BMCs or until responses from BMCs are deemed to have timed out. Consequently, any delays or failures to receive fan request messages from any of the participating BMCs may result in delays in configuring the cooling system, thus potentially resulting in overcooling or undercooling conditions. In addition, by relying on an auction process a significant number of messages must be utilized, thus further burdening the IPMI channel and increasing the likelihood of message failures and latency that result in further overcooling and undercooling.

Figure 3:
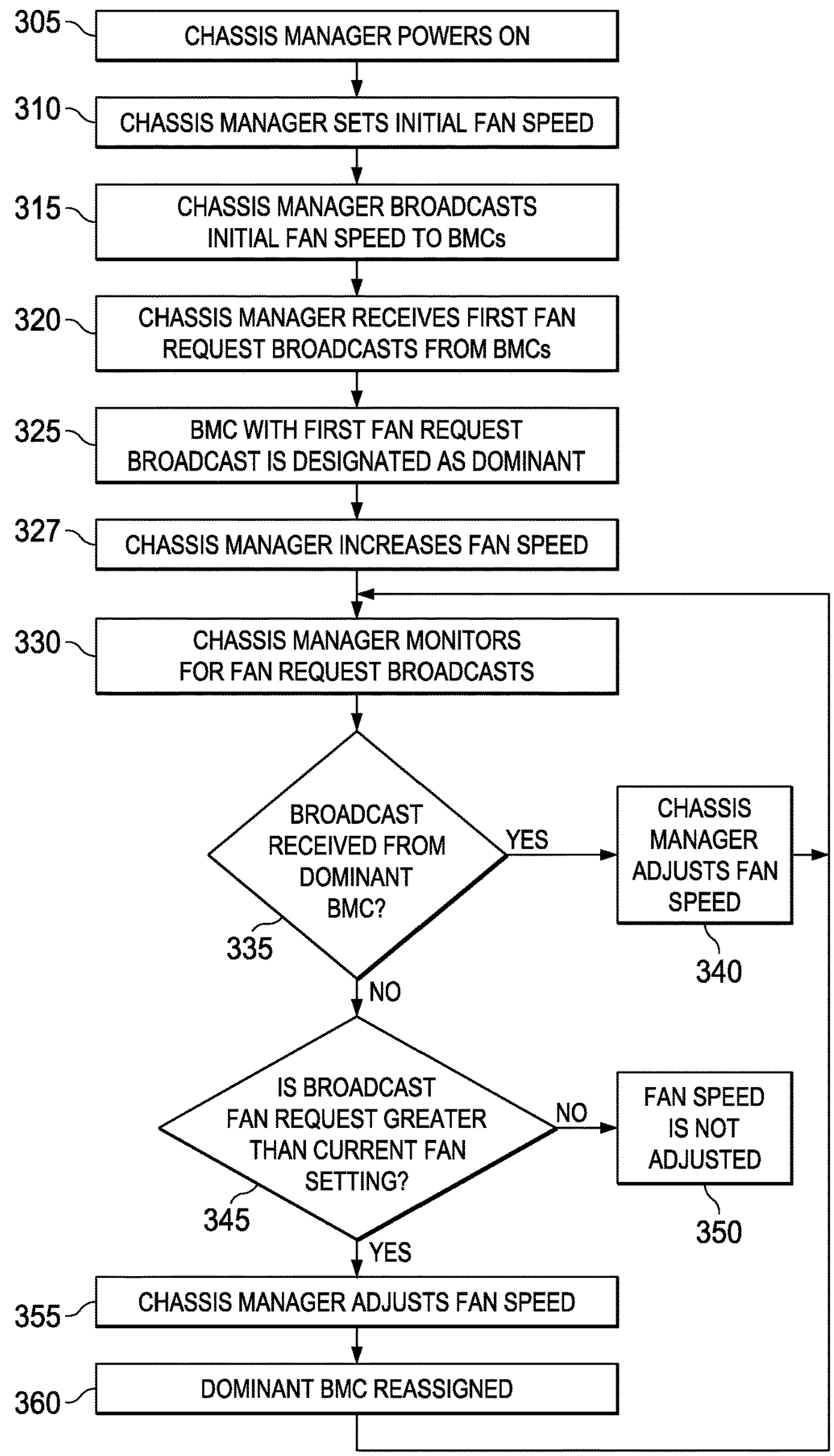
FIG. 3 is a flowchart depicting certain steps of a process according to various embodiments for controlling fan speeds within an IHS.

FIG. 3 depicts certain steps of a process according to various embodiments for controlling fan speeds using a chassis manager that controls a shared airflow cooling system. As described with respect to FIG. 1, the embodiment of FIG. 3 utilizes a chassis manager to provide airflow cooling for multiple severs configured to share an airflow cooling system. Each server utilizes a BMC to interoperate with the chassis manager in order to manage airflow cooling on behalf of a corresponding server. As illustrated, the process begins at step 305 with the chassis manager being powered on and proceeds to step 310 where the chassis manager determines an initial fan speed for use by the airflow cooling system. In certain embodiments, the chassis manager may utilize a default value as the initial fan speed. In certain embodiments, the chassis manager may calculate an initial fan speed based on parameters that describe the shared cooling system and/or the components that are relying on the shared cooling system. In certain embodiments, the chassis manager may use a thermal table to lookup an initial fan speed.

At step 315, the chassis manager broadcasts the initial fan speed setting to all participating BMCs. As opposed to the process of FIG. 2, the chassis manager in the embodiment of FIG. 3 does not conduct an auction process, and thus does not wait for fan requests from the participating BMCs, to determine an initial fan speed setting or to issue a broadcast notification of the initial fan speed setting to participating BMCs. Instead, the chassis manager is configured to generate and broadcast this initial fan speed setting without input from the participating BMCs. Configured in this manner, the chassis manager of FIG. 3 is able to provide an initial level of airflow cooling that is based on certain parameters of the shared airflow cooling system without having to wait for an auction process to complete and thus without the attendant timeout delays and resulting overcooling and undercooling that result from setting an initial fan speed using an auction process. In addition, without relying on an auction process, the number of messages required to provide initial airflow cooling is significantly reduced.

With the shared cooling system operating using the initial fan speed setting provided by the chassis manager, the chassis manger then waits for fan requests from the participating BMCs in response to the initial fan speed setting that is broadcast by the chassis manager. As described in more detail below, the participating BMCs are configured to monitor and track fan speed broadcasts that are issued by the chassis manager or by other participating BMCs. Initially, the participating BMCs receive the fan speed broadcast issued by chassis manager at step 315. Each of the participating BMCs is configured to determine a fan request based on the airflow needs of its corresponding server. If a BMC determines that its fan request requires a greater fan speed than the initial fan speed setting broadcast by the chassis manager, that BMC broadcasts its determined fan request specifying its requested fan speed. These fan requests are broadcasts by the BMC such they are received both by the chassis manager and the other participating BMCs.

At step 320, the chassis manager receives the fan request broadcasts issued by the participating BMCs that have determined that their fan request require a greater fan speed than the initial fan speed. Upon receipt of the first such fan request broadcast received in response to the initial fan speed, at step 325 the chassis manager designates the BMC issuing this first fan speed request as the dominant BMC. The chassis manager then increases, at step 327, the fan speed of the airflow cooling system to the fan speed specified by the first received fan request that exceeds the initial fan setting provided by the chassis manager. At step 330, the chassis manager continues monitoring for fan request broadcasts from the participating BMCs.

The chassis manager according to the embodiment of FIG. 3 monitors fan request broadcasts received from participating BMCs and continues to iteratively adjust the fan speed of the airflow cooling system based on the received fan requests. At step 335, the chassis manager determines whether a received fan request broadcast has been issued by the BMC designated as the dominant BMC. If the received fan speed request is issued by the dominant BMC, at step 340, the chassis manager adjusts the fans speed of the airflow cooling system accordingly. As the BMC designated as dominant, this BMC has previously issued the maximum fan speed request that is presently being used as the current fan speed setting. Accordingly, an additional fan speed request that is greater than the current fan speed indicates a need for still greater airflow by the dominant BMC. In such scenarios, the chassis manager will increase the fan speed further in order to satisfy this request for increased airflow from the dominant BMC. If the fan speed requests received from the dominant BMC at step 335 is less than the current fan speed setting, a decrease in airflow cooling is required by the dominant BMC. In such scenarios, a drop in airflow cooling requirements is indicated such that unnecessary levels of airflow cooling are potentially being provided by the chassis manager. The chassis manager thus responds, at step 340, to a lower airflow request by the dominant BMC by slowing the fan speed of the cooling system.

If the fan request broadcast received at step 335 is received from a BMC not designated as the dominant participating BMC, at step 345 the chassis manager evaluates whether the received fan request indicates a greater fan speed that then current fan speed setting that is based on the maximum fan speed request issued by the dominant BMC. If the fan speed requested is not greater than the current fan speed setting, at step 350, the chassis manager does not adjust the fan speed of the airflow cooling system. If the fan speed request received at step 345 is greater than the current fan speed setting, at step 335, the chassis manager increases the fan speed setting in order to satisfy the increased airflow cooling requirement. Since the fan speed request greater than the current fan speed setting, the dominant BMC is reassigned at step 360. The BMC issuing the fan request broadcast requiring an increase in airflow cooling is designated as the dominant BMC. The chassis manager then returns to step 330 and continues monitoring for additional fan request broadcasts.

Unlike the process described with respect to FIG. 2, the chassis manager of FIG. 3 does not issue alerts in response to determining a change to the fan speed. Whereas the process of FIG. 2 utilizes alerts to notify the participating BMCs of a change in the current fan speed setting, the current fan speed setting is determined by the BMCs in the embodiment of FIG. 3 by the BMCs themselves based on the fan requests that are broadcasts by the other participating BMCs. In this manner, the participating BMCs operate to notify each other of changes to the fan speed settings, rather than rely strictly on a central component such as the chassis manager. By decentralizing the determination of the current fan setting, message traffic is reduced and delays in adjusting fan settings caused by messaging delays are also reduced.

Figure 4:
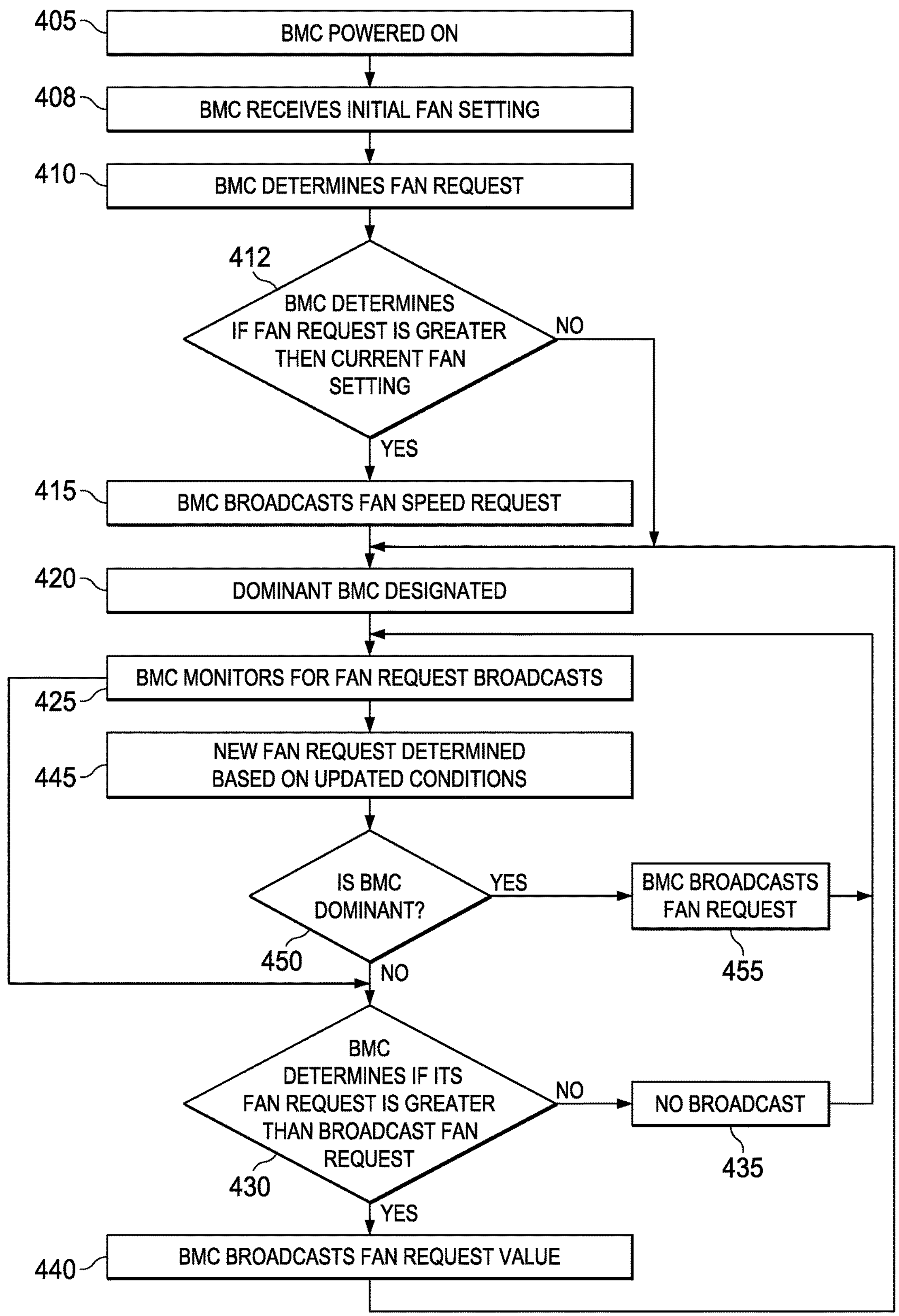
FIG. 4 is a flowchart depicting certain steps of another process according to various embodiments for controlling fan speeds within an IHS.

FIG. 4 depicts certain steps of a process according to various embodiments for controlling fan speeds using a BMCs that are configured to broadcast fan request messages, where these fan request broadcasts are received and utilized directly by other participating BMCs. The process begins at step 405 with the BMC being powered on and configured for management of airflow cooling on behalf of a corresponding server. At step 408, the BMC receives the initial fan speed setting that is determined by the chassis manager upon its initialization. At step 410, the BMC determines a fan speed request. According to various embodiments, the BMC may base its fan speed request based on sensor measurements providing one or more temperatures within the server, sensor measurements indicating ambient temperatures and/or based on a thermal table that provides fan speed settings that have been determined to provide airflow cooling for certain ranges of temperatures within the server.

At step 412, a BMC determines whether its fan request corresponds to a fan speed greater than the current fan setting in use by the chassis manager. Initially, the current fan setting is the initial fan speed specified by the chassis manager upon being powered. If the BMC determines that a fan speed greater than the current fan speed setting is required, at step 415, the BMC broadcasts its fan speed request. At step 420, the BMC that issues the greatest fan speed request in response to the initial fan speed setting broadcast is designated as the dominant BMC. In certain scenarios, the assignment of a dominant BMC may result from successive reassignment of the dominant BMCs based on the order in which fan request broadcasts are received by the chassis manager in response to its broadcast of the initial fan speed setting.

At step 425, each participating BMC monitors for fan request messages that are broadcast by other participating BMCs. At step 430, with the receipt of each fan request broadcast, a BMC determines if its airflow cooling needs correspond to a fan speed that is greater than last broadcast fan speed setting. If the BMC determines that its fan request is not greater than the last broadcast fan speed setting, at step 435, no further action is taken and the BMC continues to monitor for fan request broadcasts at step 425.

If, at step 430, the BMC determines that its fan request corresponds to a greater fan speed than the current fan speed setting, at step 440, the BMC broadcasts its fan request to the chassis manager and other participating BMCs. As the BMC with the maximum fan request, the BMC is designated as the dominant BMC at step 420 and continues monitoring for further fan request broadcast at step 425. As described, this request is received by the chassis manager and the other participating BMCs. Each BMC that receives this broadcast fan request determines whether its fan request is greater than the last broadcast fan request.

As described, participating BMCs may be configured to determine fan request settings each time a fan speed broadcast is received. In certain embodiments, participating BMCs may also be configured to determine fan request settings on a periodic basis or based on changes in temperatures measured within the corresponding server. At step 445, a BMC determines a new fan request based on a determination of updated temperature conditions within the server. At step 450, the BMC determines whether it is currently designated as the dominant BMC. If the BMC is not designated as dominant, the BMC proceeds to step 430 and only issues a fan request broadcast if its requested fan speed is greater than the current fan speed setting, which is represented by the last fan request broadcast. If the BMC has been designated as dominant, at step 455 the BMC broadcast its fan request and returns to monitoring for fan request broadcast by other participating BMCs at step 425. By broadcasting any changes to the fan request issued by a dominant BMC, a drop in the fan speed requested by the dominant BMC may result in another participating BMC having a greater fan speed request and becoming the dominant BMC.

In certain scenarios, servers are swapped in an out of a rack of servers, thus altering the servers that rely on the shared airflow cooling provided by the chassis manager. In order to support the addition of newly added servers, a BMC may be configured to broadcast a fan requests upon initialization. By default, the BMC for a newly added sever will not be a designated as the dominant BMC. As with requests received from other non-dominant BMCs, the chassis manager will evaluate whether the fan request broadcast received from this newly added BMC is greater than the current fan setting and proceed accordingly. In certain embodiments, the chassis manager will detect the addition of a new server or be otherwise notified of this addition. In response, the chassis manager will broadcast the current fan setting, thus prompting each BMC, including the newly added BMC, to broadcast a fan request.

In order to support the removal of a BMC that has been designated as the dominant BMC, the chassis manager may be configured in certain embodiments to respond to this removal by reverting to a default fan setting a broadcasting this fan setting, thus prompting fan request broadcasts from the participating BMCs. In order to respond to the failure of a BMC designated as dominant, the chassis manager may be configured in certain embodiments to detect such conditions. In such embodiments, the chassis manager may issue a query to the dominant BMC if no fan request broadcasts are received from this dominant BMC for a certain duration. In certain embodiments, the chassis manager may be configured to check the status of a thermal management process utilized by the BMC. If the chassis manager determines that thermal management process of the suspect BMC is operating within certain pre-defined parameters, the chassis manager continues normal operations. If the chassis manager determines that the thermal management process of the suspect BMC is not operating within certain pre-defined parameters, the chassis manager may be configured to broadcast a default fan setting. If no response is received from the dominant BMC, the chassis manager may report this condition. As before, in response to broadcasting the default fan setting, the chassis manager will receive fan request broadcasts from the BMCs that have fan requests greater than the default fan setting. If the dominant BMC is functioning properly and still has the maximum fan request, it will again be designated as the dominant BMC.

* * *

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for configuring airflow cooling shared by a plurality of IHSs (Information Handling Systems), the method comprising:

setting a current cooling fan speed to an initial fan speed;

broadcasting the initial fan speed to the plurality of IHSs;

determining, by each of the plurality of IHSs, a fan speed request based on airflow cooling requirements of the respective IHS;

if the fan speed request determined by an IHS is greater than the initial fan speed, broadcasting, by the IHS, a fan request comprising the fan speed request;

receiving a plurality of fan requests broadcast by one or more IHSs of the plurality of IHSs;

designating the IHS with the highest fan speed request as the dominant IHS;

setting the current cooling fan speed to the fan speed provided by the dominant IHS;

broadcasting the current fan speed to the plurality of IHSs;

determining, by each of the plurality of IHSs, an updated fan speed request based on updated airflow cooling requirements of the respective IHS; and if the updated fan speed request determined by an IHS is greater than the updated fan speed provided by the dominant IHS, broadcasting the updated fan speed request.

2. The method of claim 1, further comprising:

receiving an additional fan request broadcast from a first IHS wherein the additional fan request broadcast comprises a second fan speed; and determining whether the first IHS is designated as the dominant IHS.

3. The method of claim 2, further comprising:

if the first IHS is designated as the dominant IHS, setting the cooling fan to the second fan speed.

4. The method of claim 2, further comprising:

if the first IHS is not designated as the dominant IHS, determining if the second fan speed is greater than the current fan speed.

5. The method of claim 4, further comprising:

if the second fan speed is greater than the current fan speed:

setting the cooling fan to the second fan speed; and designating the first IHS as the dominant IHS.

6. The method of claim 1, wherein the fan request broadcasts are IPMI (Intelligent Platform Management Interface) commands.

7. The method of claim 1, wherein the plurality of IHS are rack servers housed within a rack providing a shared airflow cooling system.

8. The method of claim 1, further comprising:

broadcasting a default fan speed upon detecting the addition of an IHS to the plurality of IHSs.

9. A method for configuring a fan controller for providing airflow cooling to a first IHS comprised within a plurality of IHSs coupled via a first communication bus, the method comprising:

receiving a current fan speed setting from the fan controller as a listener on the communication bus, wherein the fan controller operates one or more cooling fans at the current fan speed to provide a first airflow cooling to the plurality of IHSs;

determining an updated fan speed for providing a second airflow cooling required by the first IHS;

determining whether the updated fan speed is greater than the current fan speed; and if the updated fan speed is greater than the current fan speed, mastering the communication bus to broadcast fan request to the plurality of IHSs, wherein the fan request specifies the updated fan speed requested by the first IHS, wherein the fan controller updates the updated fan speed as the current fan speed, and wherein the fan controller designates the first IHS as the dominant IHS and wherein the fan controller operates the one or more cooling fans at the updated fan speed to provide the second airflow cooling to the plurality of IHSs.

10. The method of claim 9, wherein the fan request is determined by the first IHS based on temperature measurements provided by one or more sensors at locations within the first IHS.

11. The method of claim 9, wherein the fan request is determined by the first IHS based on a thermal table.

12. The method of claim 9, further comprising:

receiving a broadcast fan request as a listener on the first communication bus mastered by a second IHS of the plurality of IHSs, wherein the broadcast fan request comprises a broadcast fan speed required for cooling the second IHS.

13. The method of claim 9, further comprising:

receiving an indication the first IHS has been designated as the dominant IHS;

if the updated fan speed is not greater than the current fan speed and the first IHS has been designated as the dominant IHS, mastering the communication bus to broadcast the updated fan request, wherein the fan controller updates the current fan speed based on the updated fan speed, and wherein the fan controller operates the one or more cooling fans at the updated fan speed to provide the second airflow cooling to the plurality of IHSs.

14. The method of claim 9, further comprising:

if the fan speed broadcast by the second IHS is greater than the current fan speed, setting the current fan speed based on the fan speed broadcast by the second IHS; and receiving an indication the second IHS has been designated by the fan controller as the dominant IHS.

15. The method of claim 14, further comprising:

determining a further updated fan speed for providing a third airflow cooling required by the first IHS;

if the further updated fan speed is greater than the current fan speed, mastering the communication bus to broadcast a further updated fan request, wherein the further updated fan request broadcast comprises the updated fan speed greater than the current fan speed.

16. The method of claim 15, further comprising:

if the further updated fan speed is not greater than the current fan speed and the second IHS has been designated as the dominant IHS, taking no further action regarding the further updated fan speed.

17. A chassis manager providing airflow cooling to a plurality of IHSs (Information Handling Systems), the chassis manager comprising:

a host processor; and a computer readable medium coupled to the host processor, the computer readable medium having program instructions stored thereon that, upon execution by the host processer, cause the chassis manager to:

set a current cooling fan speed to an initial fan speed;

broadcast the initial fan speed to the plurality of IHSs;

receive a plurality of fan requests broadcast by one or more IHSs comprising the plurality of IHSs, wherein each fan request broadcast comprises a fan speed request that is greater than the initial fan speed;

designate the IHS with the greatest fan speed as the dominant IHS; and set the current cooling fan speed to the greatest fan speed provided by the dominant IHS;

broadcast the current fan speed to the plurality of IHSs;

receive an updated fan request broadcast from a first IHS of the plurality of IHSs, wherein the updated fan request comprises an updated fan speed, wherein the updated fan speed request is broadcast by the first IHS if the updated fan speed is greater than the fan speed provided by the dominant IHS;

if the first IHS is the dominant IHS, set the current cooling fan speed to the updated fan speed and broadcast the current fan speed to the plurality of IHSs; and if the first IHS is not the dominant IHS, designate the first IHS as the dominant IHS.

18. The chassis manager of claim 17, further comprising program instructions stored thereon that, upon execution by the host processer, cause the chassis manager to:

receive an additional fan request broadcast from a second IHS, wherein the second IHS is not the dominant IHS; the additional fan request comprises a second fan speed; and if the second fan speed is greater than the current fan speed, designate the second IHS as the dominant IHS.

19. The chassis manager of claim 18, further comprising program instructions stored thereon that, upon execution by the host processer, cause the chassis manager to:

set the current cooling fan speed to the second fan speed; and broadcast the current fan speed to the plurality of IHSs.

20. The chassis manager of claim 17, wherein the fan request broadcasts are IPMI (Intelligent Platform Management Interface) commands.

* * * * *